(12) United States Patent
Reilly et al.

(10) Patent No.: US 9,451,724 B2
(45) Date of Patent: *Sep. 20, 2016

(54) SPEAKER COOLING

(71) Applicant: Sonos, Inc., Santa Barbara, CA (US)

(72) Inventors: Jonathon Reilly, Cambridge, MA (US); Hilmar Lehnert, Framingham, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/063,305

(22) Filed: Mar. 7, 2016

(65) Prior Publication Data

US 2016/0192537 A1   Jun. 30, 2016

Related U.S. Application Data

(63) Continuation of application No. 14/037,608, filed on Sep. 26, 2013.

(51) Int. Cl.
| | |
|---|---|
| *H04R 29/00* | (2006.01) |
| *H05K 7/20* | (2006.01) |
| *G06F 3/16* | (2006.01) |
| *H04R 3/12* | (2006.01) |

(52) U.S. Cl.
CPC .......... *H05K 7/20136* (2013.01); *G06F 3/165* (2013.01); *H04R 3/12* (2013.01); *H04R 29/001* (2013.01); *H04R 2400/03* (2013.01)

(58) Field of Classification Search
CPC .......... H04R 2499/11; H04R 2499/13; H04R 17/00; H04R 1/02; H04R 29/001
USPC ....... 381/386, 162, 190, 309, 333, 384, 400, 381/59
See application file for complete search history.

(56) References Cited

U.S. PATENT DOCUMENTS

| | | | |
|---|---|---|---|
| 4,757,547 A * | 7/1988 | Danley ................. | H04R 9/022 381/124 |
| 5,533,132 A | 7/1996 | Button | |
| 6,430,297 B1 | 8/2002 | Nakamura | |
| 6,430,300 B1 | 8/2002 | Cox et al. | |
| 6,723,913 B1 | 4/2004 | Barbetta | |
| 7,181,039 B2 | 2/2007 | Stiles et al. | |

(Continued)

OTHER PUBLICATIONS

Non-Final Office Action mailed on Aug. 24, 2015, issued in connection with U.S. Appl. No. 14/037,608, filed Sep. 26 30, 2013, 12 pages.

(Continued)

*Primary Examiner* — Akelaw Teshale
(74) *Attorney, Agent, or Firm* — McDonnell Boehnen Hulbert & Berghoff LLP

(57) ABSTRACT

Embodiments are provided for cooling one or more components of a playback device using speaker vibrations that result from inaudible audio. Movement of air molecules arising from the speaker vibrations may disperse heat away from the one or more components of a playback device. In an example implementation, while playing audible audio content via the at least one speaker, a playback device may receive input data indicating an instruction to stop playback of the audible audio content. The playback device may determine that playback of the audible audio content has stopped and based on that determination, play inaudible audio content to cause the at least one speaker to vibrate thereby inducing air movement within the playback device.

20 Claims, 8 Drawing Sheets

(56) References Cited

U.S. PATENT DOCUMENTS

| | | |
|---|---|---|
| 8,031,896 B2 | 10/2011 | Chick et al. |
| 8,031,897 B2 | 10/2011 | Bastyr et al. |
| 8,189,841 B2 | 5/2012 | Litovsky et al. |
| 8,345,892 B2 | 1/2013 | Jung et al. |
| 8,638,968 B2 | 1/2014 | Gladwin |
| 8,675,899 B2 | 3/2014 | Jung |
| 8,811,648 B2 | 8/2014 | Pance et al. |
| 8,934,657 B2 | 1/2015 | Wilk |
| 2003/0081808 A1 | 5/2003 | Kemmerer |
| 2007/0258612 A1 | 11/2007 | Mamin |
| 2008/0292128 A1 | 11/2008 | Ishii |
| 2010/0027833 A1 | 2/2010 | Takahashi |
| 2010/0289998 A1 | 11/2010 | Pei |
| 2011/0069859 A1 | 3/2011 | Kobayashi et al. |
| 2011/0216921 A1 | 9/2011 | Tseng et al. |
| 2012/0121092 A1 | 5/2012 | Starobin |
| 2013/0077810 A1 | 3/2013 | Mellow et al. |
| 2013/0089231 A1 | 4/2013 | Wilk et al. |
| 2013/0108099 A1* | 5/2013 | Kemmerer ............ H04R 9/022 381/397 |
| 2013/0202149 A1 | 8/2013 | Yoon |
| 2013/0315429 A1 | 11/2013 | Parker et al. |
| 2014/0270269 A1 | 9/2014 | Hsieh |

OTHER PUBLICATIONS

"Notice of Allowance mailed on Jan. 7, 2016, issued in connection with U.S. Appl. No. 14/037,608, filed Sep. 26 30, 2013, 10 pages".

* cited by examiner

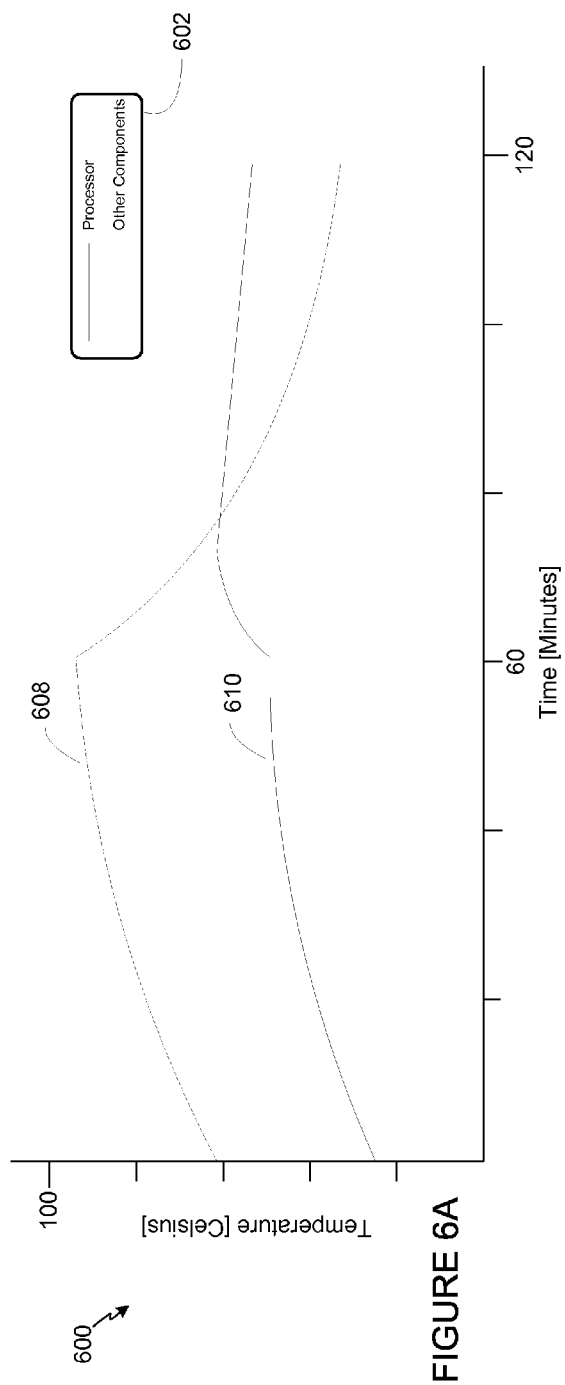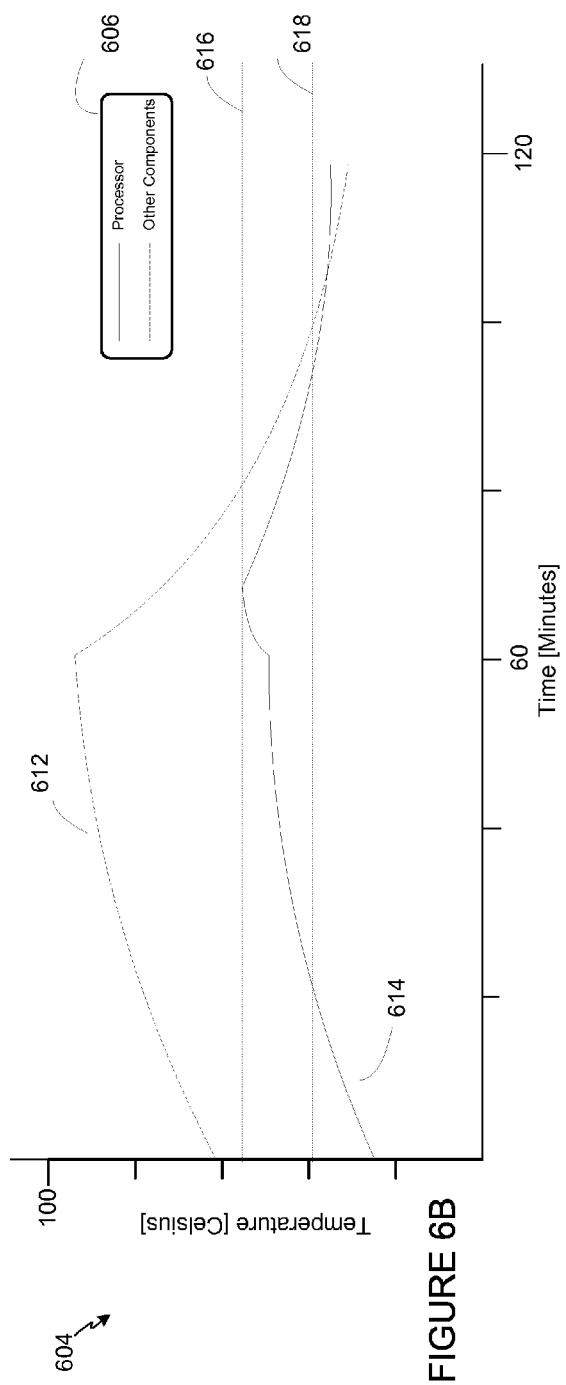
FIGURE 6A
FIGURE 6B

SPEAKER COOLING

CROSS REFERENCE TO RELATED APPLICATIONS

This application claims priority under 35 U.S.C. §120 to, and is a continuation of, U.S. non-provisional patent application Ser. No. 14/037,608, filed on Sep. 26, 2013, entitled "Speaker Cooling," which is incorporated herein by reference in its entirety.

FIELD OF THE DISCLOSURE

The disclosure is related to consumer goods and, more particularly, to methods, systems, products, features, services, and other items directed to media playback or some aspect thereof.

BACKGROUND

Digital music has become readily available due in part to the development of consumer level technology that has allowed people to listen to digital music on a personal audio device. The consumer's increasing preference for digital audio has also resulted in the integration of personal audio devices into PDAs, cellular phones, and other mobile devices. The portability of these mobile devices has enabled people to take the music listening experience with them and outside of the home. People have become able to consume digital music, like digital music files or even Internet radio, in the home through the use of their computer or similar devices. Now there are many different ways to consume digital music, in addition to other digital content including digital video and photos, stimulated in many ways by high-speed Internet access at home, mobile broadband Internet access, and the consumer's hunger for digital media.

Until recently, options for accessing and listening to digital audio in an out-loud setting were severely limited. In 2005, Sonos offered for sale its first digital audio system that enabled people to, among many other things, access virtually unlimited sources of audio via one or more networked connected zone players, dynamically group or ungroup zone players upon command, wirelessly send the audio over a local network amongst zone players, and play the digital audio out loud across multiple zone players in synchrony. The Sonos system can be controlled by software applications running on network capable mobile devices and computers.

Given the insatiable appetite of consumers towards digital media, there continues to be a need to develop consumer technology that revolutionizes the way people access and consume digital media.

BRIEF DESCRIPTION OF THE DRAWINGS

Features, aspects, and advantages of the presently disclosed technology may be better understood with regard to the following description, appended claims, and accompanying drawings where:

FIG. 6A shows a graph demonstrating example temperatures over time of various components in an example zone player;

FIG. 6B shows a graph demonstrating example temperatures over time of various components in a zone player with speaker cooling using inaudible audio.

Figure 1:
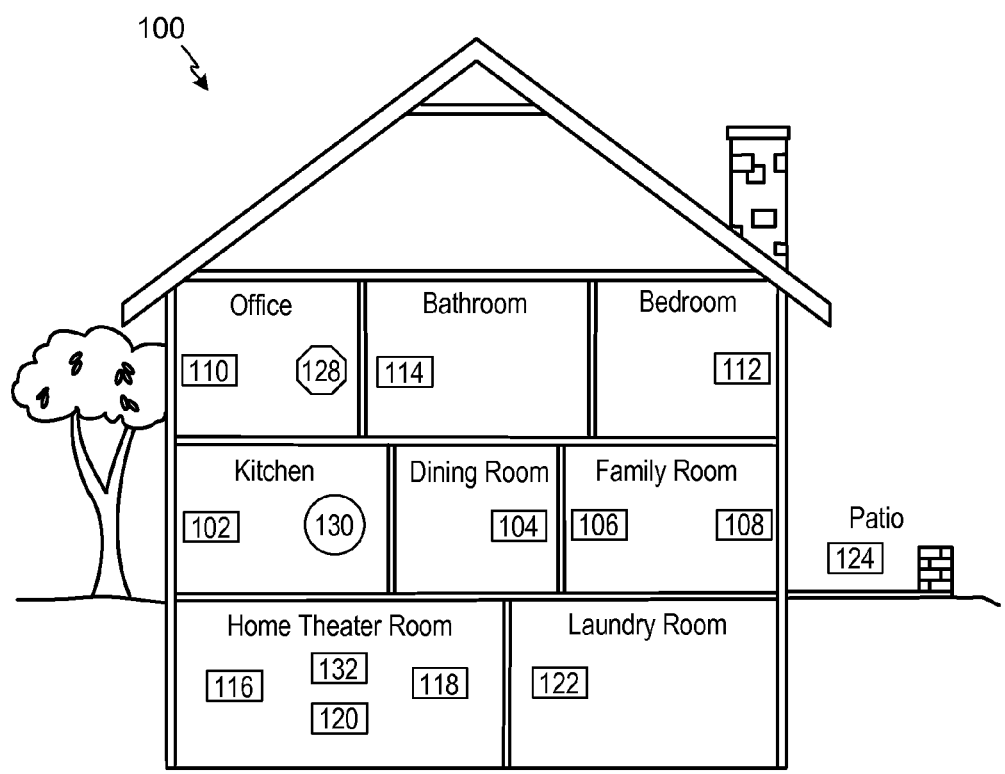
FIG. 1 shows an example configuration in which certain embodiments may be practiced.

In addition, the drawings are for the purpose of illustrating example embodiments, but it is understood that the inventions are not limited to the arrangements and instrumentality shown in the drawings.

DETAILED DESCRIPTION

I. Overview

Embodiments described herein involve speaker cooling using inaudible audio content in a playback device based on temperatures of components and/or presence of audible audio content. In one example, a household of a user may include one or more playback devices configured as a network media system. In discussions herein, playback devices may also be referred to as zone players. Each playback device in the one or more playback devices may include one or more components. The one or more components may include a processor module, a memory, a power supply, an audio amplifier, and one or more speakers, for example. In some cases, the processor module and/or other components of the playback device may remain "active" even when the playback device is not outputting audio content. For discussions herein, however, a playback device in the one or more playback devices may be considered to be in an "active state" when the playback device is outputting audible audio content and may be considered to be in an "inactive state" when the playback device is not outputting audible audio content, even if the processor module remains active.

The one or more components of the playback device may each generate heat at different rates, whether the playback device is in the active state or the inactive state. In a case the playback device is in the active state, audio playback by the one or more speakers of the playback device may generate air movement that may contribute to a cooling of some or all of the one or more components. Cooling in this context may refer to dispersing heat away from some of the one or more components and effectively lowering of temperature around those components. When the playback device is no longer active, however, cooling of some or all of the one or more components may be reduced because the speaker may no longer be generating air movement that may contribute to the cooling. Further, as indicated above, some of the one or more components of the playback device may remain active even when the playback device is in the inactive state. As such, when the playback device is no longer in the active state, temperatures for some of the one or more components may continue to increase, without air movement generated from the speakers to contribute to cooling.

The playback device may be in a sealed enclosure or in a ported enclosure. As such, in some cases, cooling of the one or more components may vary depending on the type of enclosure the playback device is in, and where within the enclosure each of the one or more components may be positioned.

In one example, the playback device may be configured to play inaudible audio content when the playback device is in the inactive state, such that air movement may be generated by the one or more speakers to contribute to the cooling of some or all of the one or more components in the playback device.

In another example, one or more thermal sensors in the playback device may be configured to detect a temperature on or around the one or more components. When a detected temperature on or around the one or more components is higher than a first predetermined threshold value, the playback device may be configured to play inaudible audio content. In this context, the inaudible audio content may include inaudible frequencies that, when played by the playback device, may cause at least one of the one or more speakers to vibrate. The vibration of the at least one of the one or more speakers may result in movement of air that may contribute to the cooling of at least one of the one or more components, as discussed above.

As mentioned, the inaudible audio content may include frequencies within a frequency range inaudible to an average human being. In one example, the frequency range may include frequencies outside the range of 20 Hz to 20 kHz. In example embodiment, the one or more speakers may play audio content from one or more frequency ranges. For instance, one of the one or more speakers may play audio content from a frequency range below 20 Hz, a frequency range above 20 kHz, or may play audio content in both frequency ranges below 20 Hz and above 20 kHz. The frequency range or ranges of the inaudible audio content may be predetermined or may be randomly selected by the playback device. Further, each of the one or more speakers may play inaudible audio content from the same frequency range or from different frequency ranges. Other examples are also possible.

The playback device may be configured to play the inaudible audio content when a determination is made that the playback device is no longer playing audible audio content. Determination of whether the playback device is playing audible audio content may be performed by a processor module or an audio processing component of the playback device, among others. There may be one or more indicators that may help determine whether an audible audio content is playing.

A first example indicator may be that the playback device is streaming audio content from a playback queue. A second example indicator may be that an input has been received to cause the playback device to play chosen audio content. In one instance, the input may be received from a controller in communication with the playback device. A third example indicator may be the playback of audio content, such as audio content having frequencies between 20 Hz and 20 kHz. More specifically, a processor may be configured analyze the audio content being played by the playback device and determine whether the audio content includes frequencies between 20 Hz and 20 kHz. One having ordinary skill in the art will appreciate that audible audio content in some cases may also include frequencies below 20 Hz and above 20 kHz. The indicators discussed may be used in any combination to determine that audible audio content is being played by the playback device. Other indicators are possible as well.

In one case, the playback device may be configured to stop playing the inaudible audio content when the temperature of one or more components is below a second predetermined threshold. Stopping playback of the inaudible audio content may be performed by one or more components such as a processor of the playback device. In one example, the first predetermined threshold mentioned above and second predetermined threshold may be the same for each of the one or more components. In another case, the first predetermined threshold and second predetermined threshold may be different for one or more of the one or more components. Other examples are also possible.

In another case, the playback device may be configured to stop playing the inaudible audio content when the playback device begins to play audible audio content. As described above, there may be several example indicators that may be based on to determine that the playback device is playing, or will be playing audible audio content. In this case, stopping playback of the inaudible audio content may also be done by one or more components such as a processor.

As indicated above, the present application involves speaker cooling using inaudible audio content in a playback device based on temperature of components and/or presence of audible audio content. In one aspect, a method is provided. The method involves determining, based on a detection by a thermal sensor, a temperature on or around one or more components that are located within a sealed enclosure of a playback device. The playback device comprises at least one speaker configured to play audio content. The method also involves determining that the temperature is greater than a predetermined value and responsively causing the at least one speaker to play inaudible audio content. The playback of inaudible audio content causes the at least one speaker to vibrate and disperse heat away from the one or more components.

In another aspect, a second method is provided. The method involves determining, based on detection by a thermal sensor, whether a temperature of at least a portion of the playback device is above a first predetermined temperature. The method further involves determining, based on detection by a thermal sensor, whether a temperature of at least a portion of the playback device is above a first predetermined temperature. The method also involves determining by the playback device whether the playback device is playing audible audio content through the speaker and playing inaudible audio content by the playback device when: (i) the temperature of the at least a portion of the playback device is determined to be above the first predetermined temperature, and (ii) the playback device is determined to not be playing audible audio content.

In yet another aspect, a non-transitory computer readable storage medium is provided. The non-transitory computer readable storage medium includes a set of instructions for execution by a processor. The set of instructions, when executed, cause a playback device to determine whether a temperature of at least a portion of the playback device is above a first predetermined temperature. The set of instructions, when executed, also cause a playback device to determine whether the playback device is playing audible audio content and play inaudible audio content when: (i) the temperature of the at least a portion of the playback device is determined to be above the first predetermined temperature, and (ii) the playback device is determined not to be playing audible audio content.

Other embodiments, as those discussed in the following and others as can be appreciated by one having ordinary skill in the art are also possible.

II. Example Operating Environment

Referring now to the drawings, in which like numerals can refer to like parts throughout the figures, FIG. 1 shows an example media system configuration 100 in which one or more embodiments disclosed herein can be practiced or implemented.

By way of illustration, the media system configuration 100 is associated with a home having multiple zones, although it should be understood that the home could be configured with only one zone. Additionally, one or more zones can be added to the configuration 100 over time. Each zone may be assigned by a user to a different room or space, such as, for example, an office, bathroom, bedroom, kitchen, dining room, family room, home theater room, utility or laundry room, and patio. A single zone might also include multiple rooms or spaces if so configured. With respect to FIG. 1, one or more of zone players 102-124 are shown in each respective zone. Zone players 102-124, also referred to herein as playback devices, multimedia units, speakers, players, and so on, provide audio, video, and/or audiovisual output. A controller 130 (e.g., shown in the kitchen for purposes of this illustration) provides control to the media system configuration 100. Controller 130 may be fixed to a zone, or alternatively, mobile such that it can be moved about the zones. The media system configuration 100 may also include more than one controller 130, and additional controllers may be added to the system over time.

The media system configuration 100 illustrates an example whole house media system, though it is understood that the technology described herein is not limited to, among other things, its particular place of application or to an expansive system like a whole house media system 100 of FIG. 1.

a. Example Zone Players

Figure 2A:
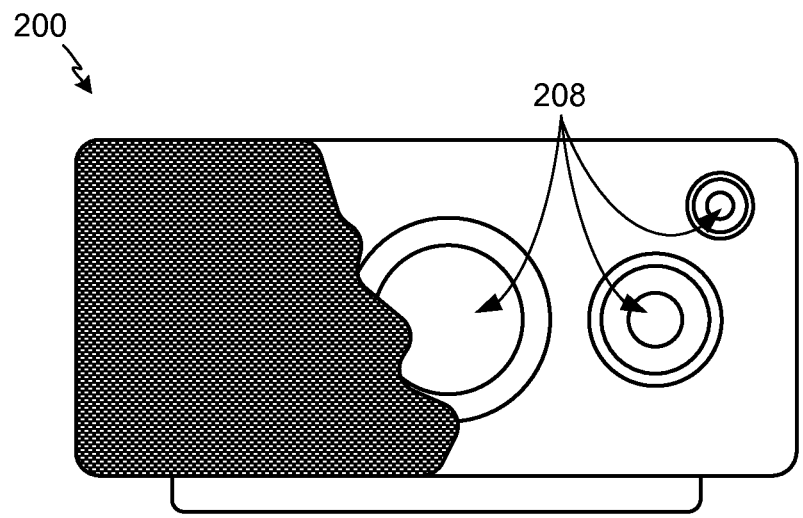
FIG. 2A shows an illustration of an example zone player having a built-in amplifier and transducers.
Figure 2B:
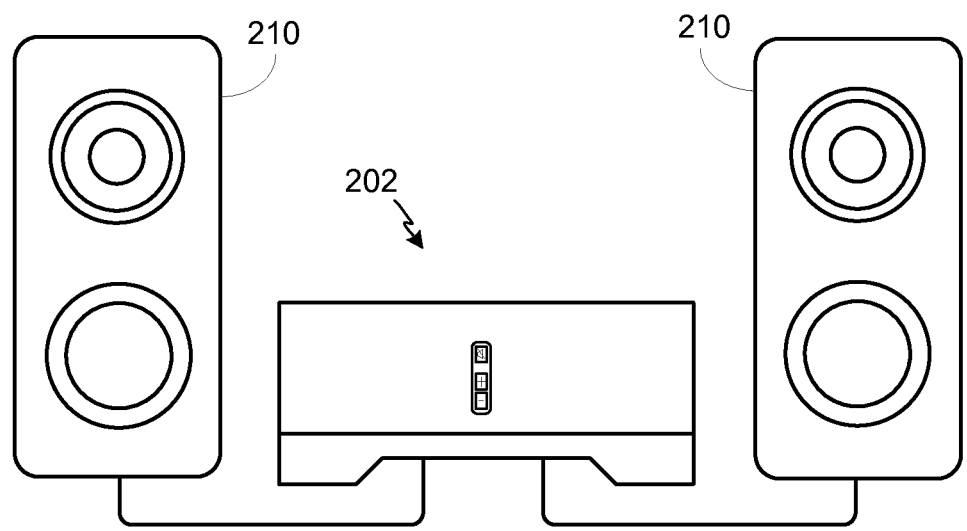
FIG. 2B shows an illustration of an example zone player having a built-in amplifier and connected to external speakers.
Figure 2C:
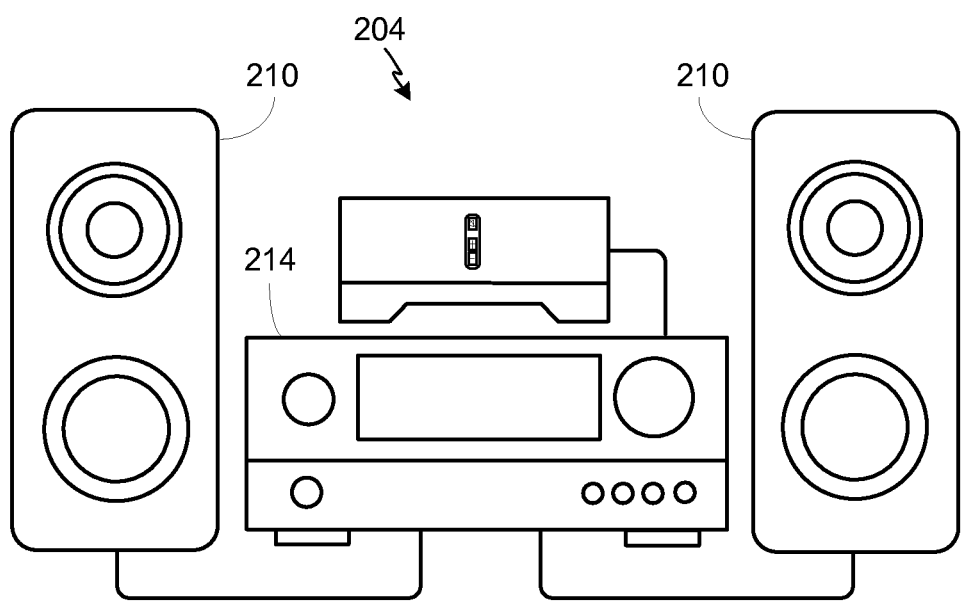
FIG. 2C shows an illustration of an example zone player connected to an A/V receiver and speakers.

FIGS. 2A, 2B, and 2C show example types of zone players. Zone players 200, 202, and 204 of FIGS. 2A, 2B, and 2C, respectively, can correspond to any of the zone players 102-124 of FIG. 1, for example. In some embodiments, audio is reproduced using only a single zone player, such as by a full-range player. In some embodiments, audio is reproduced using two or more zone players, such as by using a combination of full-range players or a combination of full-range and specialized players. In some embodiments, zone players 200-204 may also be referred to as a "smart speaker," because they contain processing capabilities beyond the reproduction of audio, more of which is described below.

FIG. 2A illustrates a zone player 200 that includes sound producing equipment 208 capable of reproducing full-range sound. The sound may come from an audio signal that is received and processed by zone player 200 over a wired or wireless data network. Sound producing equipment 208 includes one or more built-in amplifiers and one or more acoustic transducers (e.g., speakers). A built-in amplifier is described more below with respect to FIG. 3. A speaker or acoustic transducer can include, for example, any of a tweeter, a mid-range driver, a low-range driver, and a subwoofer. In some embodiments, zone player 200 can be statically or dynamically configured to play stereophonic audio, monaural audio, or both. In some embodiments, zone player 200 may be dynamically configured to reproduce a subset of full-range sound, such as when zone player 200 is grouped with other zone players to play stereophonic audio, monaural audio, and/or surround audio or when the media content received by zone player 200 is less than full-range.

FIG. 2B illustrates zone player 202 that includes a built-in amplifier to power a set of detached speakers 210. A detached speaker can include, for example, any type of loudspeaker. Zone player 202 may be configured to power one, two, or more separate loudspeakers. Zone player 202 may be configured to communicate an audio signal (e.g., right and left channel audio or more channels depending on its configuration) to the detached speakers 210 via a wired path.

FIG. 2C illustrates zone player 204 that does not include a built-in amplifier, but is configured to communicate an audio signal, received over a data network, to an audio (or "audio/video") receiver 214 with built-in amplification.

Referring back to FIG. 1, in some embodiments, one, some, or all of the zone players 102 to 124 can retrieve audio directly from a source. For example, a particular zone player in a zone or zone group may be assigned to a playback queue (or "queue"). The playback queue contains information corresponding to zero or more audio items for playback by the associated zone or zone group. The playback queue may be stored in memory on a zone player or some other designated device. Each item contained in the playback queue may comprise a uniform resource identifier (URI) or some other identifier that can be used by the zone player(s) to seek out and/or retrieve the audio items from the identified audio source(s). Depending on the item, the audio source might be found on the Internet (e.g., the cloud), locally from another device over the data network 128 (described further below), from the controller 130, stored on the zone player itself, or from an audio source communicating directly to the zone player. In some embodiments, the zone player can reproduce the audio itself (e.g., play the audio), send the audio to another zone player for reproduction, or both where the audio is reproduced by the zone player as well as one or more additional zone players (possibly in synchrony). In some embodiments, the zone player may play a first audio content (or alternatively, may not play the content at all), while sending a second, different audio content to another zone player(s) for reproduction. To the user, each item in a playback queue is represented on an interface of a controller by an element such as a track name, album name, radio station name, playlist, or other some other representation. A user can populate the playback queue with audio items of interest. The user may also modify and clear the playback queue, if so desired.

By way of illustration, SONOS, Inc. of Santa Barbara, Calif. presently offers for sale zone players referred to as a "PLAY:5," "PLAY:3," "PLAYBAR," "CONNECT:AMP," "CONNECT," and "SUB." Any other past, present, and/or future zone players can additionally or alternatively be used to implement the zone players of example embodiments disclosed herein. Additionally, it is understood that a zone player is not limited to the particular examples illustrated in FIGS. 2A, 2B, and 2C or to the SONOS product offerings. For example, a zone player may include a wired or wireless headphone. In yet another example, a zone player might include a sound bar for television. In yet another example, a zone player may include or interact with a docking station for an Apple iPod™ or similar device.

b. Example Data Connection

Zone players 102-124 of FIG. 1 are coupled directly or indirectly to a data network, such as data network 128. Controller 130 may also be coupled directly or indirectly to data network 128 or individual zone players. Data network 128 is represented by an octagon in the figure to stand out from other representative components. While data network 128 is shown in a single location, it is understood that such a network is distributed in and around system 100. Particularly, data network 128 can be a wired network, a wireless network, or a combination of both wired and wireless networks. In some embodiments, one or more of the zone players 102-124 are wirelessly coupled to data network 128 based on a proprietary mesh network. In some embodiments, one or more of the zone players are coupled to data network 128 using a centralized access point such as a wired or wireless router. In some embodiments, one or more of the zone players 102-124 are coupled via a wire to data network 128 using Ethernet or similar technology. In addition to the one or more zone players 102-124 connecting to data network 128, data network 128 can further allow access to a wide area network, such as the Internet.

In some embodiments, connecting any of the zone players 102-124, or some other connecting device, to a broadband router, can create data network 128. Other zone players 102-124 can then be added wired or wirelessly to the data network 128. For example, a zone player (e.g., any of zone players 102-124) can be added to the system configuration 100 by simply pressing a button on the zone player itself (or perform some other action), which enables a connection to be made to data network 128. The broadband router can be connected to an Internet Service Provider (ISP), for example. The broadband router can be used to form another data network within the system configuration 100, which can be used in other applications (e.g., web surfing). Data network 128 can also be used in other applications, if so programmed. An example, second network may implement SONOSNET™ protocol, developed by SONOS, Inc. of Santa Barbara. SONOSNET™ represents a secure, AES-encrypted, peer-to-peer wireless mesh network. Alternatively, in certain embodiments, the data network 128 is the same network, such as a traditional wired or wireless network, used for other applications in the household.

c. Example Zone Configurations

A particular zone can contain one or more zone players. For example, the family room of FIG. 1 contains two zone players 106 and 108, while the kitchen is shown with one zone player 102. In another example, the home theater room contains additional zone players to play audio from a 5.1 channel or greater audio source (e.g., a movie encoded with 5.1 or greater audio channels). In some embodiments, one can position a zone player in a room or space and assign the zone player to a new or existing zone via controller 130. As such, zones may be created, combined with another zone, removed, and given a specific name (e.g., "Kitchen"), if so desired and programmed to do so with controller 130. Moreover, in some embodiments, zone configurations may be dynamically changed even after being configured using controller 130 or some other mechanism.

In some embodiments, if a zone contains two or more zone players, such as the two zone players 106 and 108 in the family room, then the two zone players 106 and 108 can be configured to play the same audio source in synchrony, or the two zone players 106 and 108 can be paired to play two separate sounds in left and right channels, for example. In other words, the stereo effects of a sound can be reproduced or enhanced through the two zone players 106 and 108, one for the left sound and the other for the right sound. In certain embodiments, paired zone players (also referred to as "bonded zone players") can play audio in synchrony with other zone players in the same or different zones.

In some embodiments, two or more zone players can be sonically consolidated to form a single, consolidated zone player. A consolidated zone player (though made up of multiple, separate devices) can be configured to process and reproduce sound differently than an unconsolidated zone player or zone players that are paired, because a consolidated zone player will have additional speaker drivers from which sound can be passed. The consolidated zone player can further be paired with a single zone player or yet another consolidated zone player. Each playback device of a consolidated playback device can be set in a consolidated mode, for example.

According to some embodiments, one can continue to do any of: group, consolidate, and pair zone players, for example, until a desired configuration is complete. The actions of grouping, consolidation, and pairing are preferably performed through a control interface, such as using controller 130, and not by physically connecting and re-connecting speaker wire, for example, to individual, discrete speakers to create different configurations. As such, certain embodiments described herein provide a more flexible and dynamic platform through which sound reproduction can be offered to the end-user.

d. Example Audio Sources

In some embodiments, each zone can play from the same audio source as another zone or each zone can play from a different audio source. For example, someone can be grilling on the patio and listening to jazz music via zone player 124, while someone is preparing food in the kitchen and listening to classical music via zone player 102. Further, someone can be in the office listening to the same jazz music via zone player 110 that is playing on the patio via zone player 124. In some embodiments, the jazz music played via zone players 110 and 124 is played in synchrony. Synchronizing playback amongst zones allows for an individual to pass through zones while seamlessly (or substantially seamlessly) listening to the audio. Further, zones can be put into a "party mode" such that all associated zones will play audio in synchrony.

Sources of audio content to be played by zone players 102-124 are numerous. In some embodiments, audio on a zone player itself may be accessed and played. In some embodiments, audio on a controller may be accessed via the data network 128 and played. In some embodiments, music from a personal library stored on a computer or networked-attached storage (NAS) may be accessed via the data network 128 and played. In some embodiments, Internet radio stations, shows, and podcasts may be accessed via the data network 128 and played. Music or cloud services that let a user stream and/or download music and audio content may be accessed via the data network 128 and played. Further, music may be obtained from traditional sources, such as a turntable or CD player, via a line-in connection to a zone player, for example. Audio content may also be accessed using a different protocol, such as Airplay™, which is a wireless technology by Apple, Inc., for example. Audio content received from one or more sources can be shared amongst the zone players 102 to 124 via data network 128 and/or controller 130. The above-disclosed sources of audio content are referred to herein as network-based audio information sources. However, network-based audio information sources are not limited thereto.

In some embodiments, the example home theater zone players 116, 118, 120 are coupled to an audio information source such as a television 132. In some examples, the television 132 is used as a source of audio for the home theater zone players 116, 118, 120, while in other examples audio information from the television 132 may be shared with any of the zone players 102-124 in the audio system 100.

III. Example Zone Players

Figure 3:
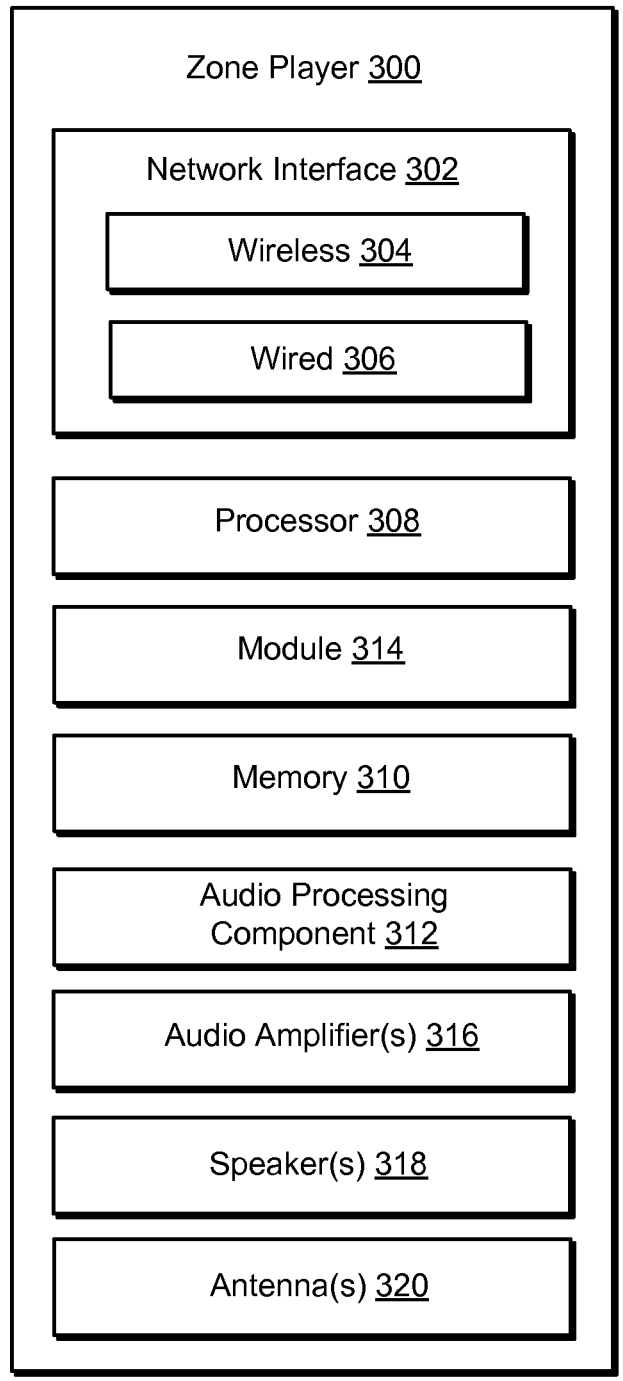
FIG. 3 shows an internal functional block diagram of an example zone player.

Referring now to FIG. 3, there is shown an example block diagram of a zone player 300 in accordance with an embodiment. Zone player 300 includes a network interface 302, a processor 308, a memory 310, an audio processing component 312, one or more modules 314, an audio amplifier 316, and a speaker unit 318 coupled to the audio amplifier 316. FIG. 2A shows an example illustration of such a zone player. Other types of zone players may not include the speaker unit 318 (e.g., such as shown in FIG. 2B) or the audio amplifier 316 (e.g., such as shown in FIG. 2C). Further, it is contemplated that the zone player 300 can be integrated into another component. For example, the zone player 300 could be constructed as part of a television, lighting, or some other device for indoor or outdoor use.

In some embodiments, network interface 302 facilitates a data flow between zone player 300 and other devices on a data network 128. In some embodiments, in addition to getting audio from another zone player or device on data network 128, zone player 300 may access audio directly from the audio source, such as over a wide area network or on the local network. In some embodiments, the network interface 302 can further handle the address part of each packet so that it gets to the right destination or intercepts packets destined for the zone player 300. Accordingly, in certain embodiments, each of the packets includes an Internet Protocol (IP)-based source address as well as an IP-based destination address.

In some embodiments, network interface 302 can include one or both of a wireless interface 304 and a wired interface 306. The wireless interface 304, also referred to as a radio frequency (RF) interface, provides network interface functions for the zone player 300 to wirelessly communicate with other devices (e.g., other zone player(s), speaker(s), receiver(s), component(s) associated with the data network 128, and so on) in accordance with a communication protocol (e.g., any wireless standard including IEEE 802.11a, 802.11b, 802.11g, 802.11n, 802.11ac, 802.15, 4G mobile communication standard, and so on). Wireless interface 304 may include one or more radios. To receive wireless signals and to provide the wireless signals to the wireless interface 304 and to transmit wireless signals, the zone player 300 includes one or more antennas 320. The wired interface 306 provides network interface functions for the zone player 300 to communicate over a wire with other devices in accordance with a communication protocol (e.g., IEEE 802.3). In some embodiments, a zone player includes multiple wireless 304 interfaces. In some embodiments, a zone player includes multiple wired 306 interfaces. In some embodiments, a zone player includes both of the interfaces 304 and 306. In some embodiments, a zone player 300 includes only the wireless interface 304 or the wired interface 306.

In some embodiments, the processor 308 is a clock-driven electronic device that is configured to process input data according to instructions stored in memory 310. The memory 310 is data storage that can be loaded with one or more software module(s) 314, which can be executed by the processor 308 to achieve certain tasks. In the illustrated embodiment, the memory 310 is a tangible machine-readable medium storing instructions that can be executed by the processor 308. In some embodiments, a task might be for the zone player 300 to retrieve audio data from another zone player or a device on a network (e.g., using a uniform resource locator (URL) or some other identifier). In some embodiments, a task may be for the zone player 300 to send audio data to another zone player or device on a network. In some embodiments, a task may be for the zone player 300 to synchronize playback of audio with one or more additional zone players. In some embodiments, a task may be to pair the zone player 300 with one or more zone players to create a multi-channel audio environment. Additional or alternative tasks can be achieved via the one or more software module(s) 314 and the processor 308.

The audio processing component 312 can include one or more digital-to-analog converters (DAC), an audio preprocessing component, an audio enhancement component or a digital signal processor, and so on. In some embodiments, the audio processing component 312 may be part of processor 308. In some embodiments, the audio that is retrieved via the network interface 302 is processed and/or intentionally altered by the audio processing component 312. Further, the audio processing component 312 can produce analog audio signals. The processed analog audio signals are then provided to the audio amplifier 316 for playback through speakers 318. In addition, the audio processing component 312 can include circuitry to process analog or digital signals as inputs to play from zone player 300, send to another zone player on a network, or both play and send to another zone player on the network. An example input includes a line-in connection (e.g., an auto-detecting 3.5 mm audio line-in connection).

The audio amplifier 316 is a device(s) that amplifies audio signals to a level for driving one or more speakers 318. The one or more speakers 318 can include an individual transducer (e.g., a "driver") or a complete speaker system that includes an enclosure including one or more drivers. A particular driver can be a subwoofer (e.g., for low frequencies), a mid-range driver (e.g., for middle frequencies), and a tweeter (e.g., for high frequencies), for example. An enclosure can be sealed or ported, for example. Each transducer may be driven by its own individual amplifier.

A commercial example, presently known as the PLAY:5™, is a zone player with a built-in amplifier and speakers that is capable of retrieving audio directly from the source, such as on the Internet or on the local network, for example. In particular, the PLAY:5™ is a five-amp, five-driver speaker system that includes two tweeters, two mid-range drivers, and one woofer. When playing audio content via the PLAY:5, the left audio data of a track is sent out of the left tweeter and left mid-range driver, the right audio data of a track is sent out of the right tweeter and the right mid-range driver, and mono bass is sent out of the subwoofer. Further, both mid-range drivers and both tweeters have the same equalization (or substantially the same equalization). That is, they are both sent the same frequencies but from different channels of audio. Audio from Internet radio stations, online music and video services, downloaded music, analog audio inputs, television, DVD, and so on, can be played from the PLAY:5™.

IV. Playback Queue

As discussed above, in some embodiments, a zone player may be assigned to a playback queue identifying zero or more media items for playback by the zone player. The media items identified in a playback queue may be represented to the user via an interface on a controller. For instance, the representation may show the user (or users if more than one controller is connected to the system) how the zone player is traversing the playback queue, such as by highlighting the "now playing" item, graying out the previously played item(s), highlighting the to-be-played item(s), and so on.

In some embodiments, a single zone player is assigned to a playback queue. For example, zone player 114 in the bathroom of FIG. 1 may be linked or assigned to a "Bathroom" playback queue. In an embodiment, the "Bathroom" playback queue might have been established by the system as a result of the user naming the zone player 114 to the bathroom. As such, contents populated and identified in the "Bathroom" playback queue can be played via the zone player 114 (the bathroom zone).

In some embodiments, a zone or zone group is assigned to a playback queue. For example, zone players 106 and 108 in the family room of FIG. 1 may be linked or assigned to a "Family room" playback queue. In another example, if family room and dining room zones were grouped, then the new group would be linked or assigned to a family room+dining room playback queue. In some embodiments, the family room+dining room playback queue would be established based upon the creation of the group. In some embodiments, upon establishment of the new group, the family room+dining room playback queue can automatically include the contents of one (or both) of the playback queues associated with either the family room or dining room or both. In one instance, if the user started with the family room and added the dining room, then the contents of the family room playback queue would become the contents of the family room+dining room playback queue. In another instance, if the user started with the family room and added the dining room, then the family room playback queue would be renamed to the family room+dining room playback queue. If the new group was "ungrouped," then the family room+dining room playback queue may be removed from the system and/or renamed to one of the zones (e.g., renamed to "family room" or "dining room"). After ungrouping, each of the family room and the dining room will be assigned to a separate playback queue. One or more of the zone players in the zone or zone group may store in memory the associated playback queue.

As such, when zones or zone groups are "grouped" or "ungrouped" dynamically by the user via a controller, the system will, in some embodiments, establish or remove/rename playback queues respectively, as each zone or zone group is to be assigned to a playback queue. In other words, the playback queue operates as a container that can be populated with media items for playback by the assigned zone. In some embodiments, the media items identified in a playback queue can be manipulated (e.g., re-arranged, added to, deleted from, and so on).

Figure 4:
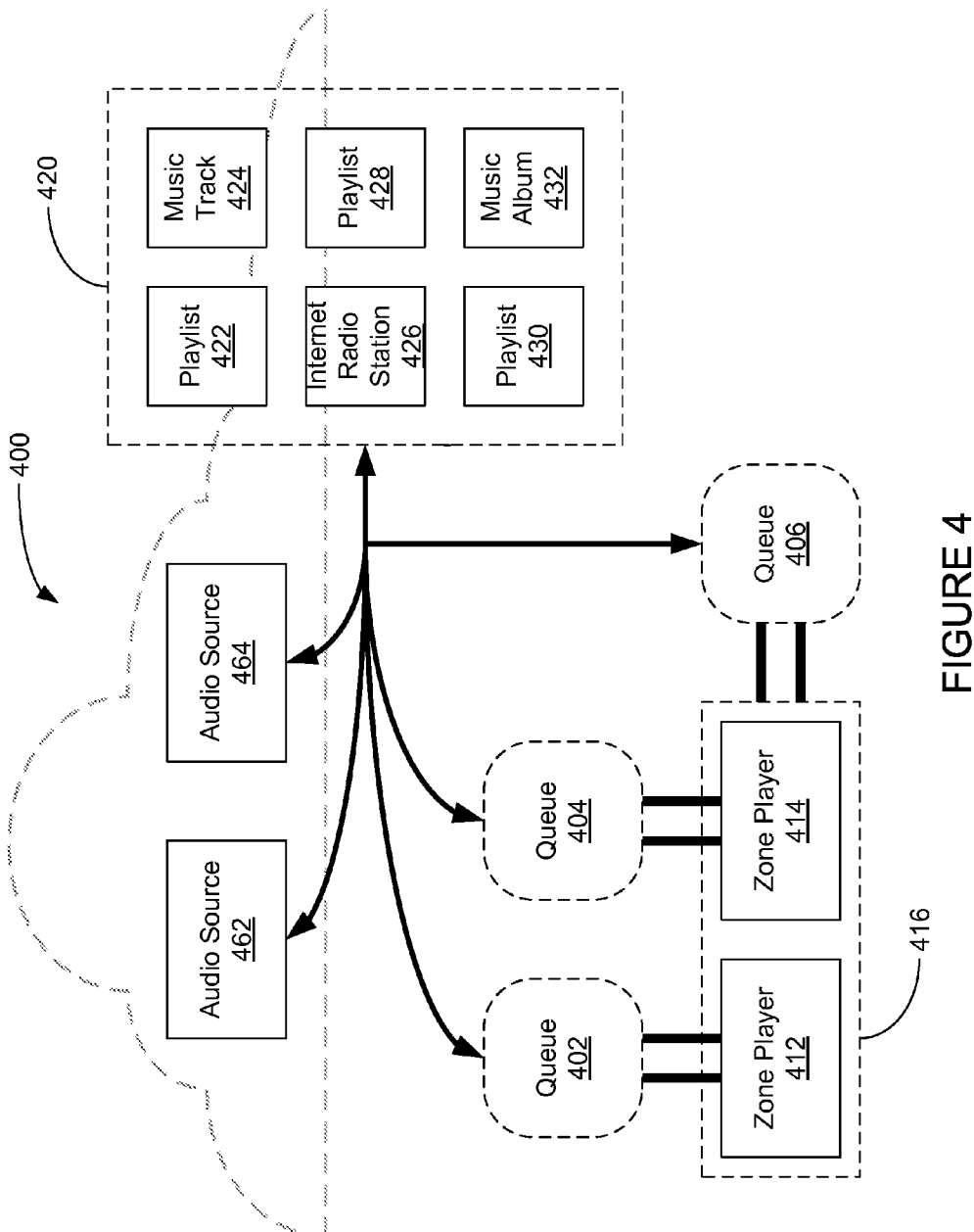
FIG. 4 shows an example playback queue configuration for a network media system.

By way of illustration, FIG. 4 shows an example network 400 for media content playback. As shown, the example network 400 includes example zone players 412 and 414, example audio sources 462 and 464, and example media items 420. The example media items 420 may include playlist 422, music track 424, favorite Internet radio station 426, playlists 428 and 430, and album 432. In one embodiment, the zone players 412 and 414 may be any of the zone players shown in FIGS. 1, 2, and 3. For instance, zone players 412 and 414 may be the zone players 106 and 108 in the Family Room.

In one example, the example audio sources 462 and 464, and example media items 420 may be partially stored on a cloud network. In some cases, the portions of the audio sources 462, 464, and example media items 420 may be stored locally on one or both of the zone players 412 and 414. In one embodiment, playlist 422, favorite Internet radio station 426, and playlist 430 may be stored locally, and music track 424, playlist 428, and album 432 may be stored on the cloud network.

Each of the example media items 420 may be a list of media items playable by a zone player(s). In one embodiment, the example media items may be a collection of links or pointers (i.e., URI) to the underlying data for media items that are stored elsewhere, such as the audio sources 462 and 464. In another embodiment, the media items may include pointers to media content stored on the local zone player, another zone player over a local network, or a controller device connected to the local network.

As shown, the example network 400 may also include an example queue 402 associated with the zone player 412, and an example queue 404 associated with the zone player 414. Queue 406 may be associated with a group, when in existence, comprising zone players 412 and 414. Queue 406 might comprise a new queue or exist as a renamed version of queue 402 or 604. In some embodiments, in a group, the zone players 412 and 414 would be assigned to queue 406 and queue 402 and 404 would not be available at that time. In some embodiments, when the group is no longer in existence, queue 406 is no longer available. Each zone player and each combination of zone players in a network of zone players, such as those shown in FIG. 1 or that of example zone players 412, 414, and example combination 416, may be uniquely assigned to a corresponding playback queue.

A playback queue, such as playback queues 402-406, may include identification of media content to be played by the corresponding zone player or combination of zone players. As such, media items added to the playback queue are to be played by the corresponding zone player or combination of zone players. The zone player may be configured to play items in the queue according to a specific order (such as an order in which the items were added), in a random order, or in some other order.

The playback queue may include a combination of playlists and other media items added to the queue. In one embodiment, the items in playback queue 402 to be played by the zone player 412 may include items from the audio sources 462, 464, or any of the media items 422-432. The playback queue 402 may also include items stored locally on the zone player 412, or items accessible from the zone player 414. For instance, the playback queue 402 may include Internet radio 426 and album 432 items from audio source 462, and items stored on the zone player 412.

When a media item is added to the queue via an interface of a controller, a link to the item may be added to the queue. In a case of adding a playlist to the queue, links to the media items in the playlist may be provided to the queue. For example, the playback queue 402 may include pointers from the Internet radio 426 and album 432, pointers to items on the audio source 462, and pointers to items on the zone player 412. In another case, a link to the playlist, for example, rather than a link to the media items in the playlist may be provided to the queue, and the zone player or combination of zone players may play the media items in the playlist by accessing the media items via the playlist. For example, the album 432 may include pointers to items stored on audio source 462. Rather than adding links to the items on audio source 462, a link to the album 432 may be added to the playback queue 402, such that the zone player 412 may play the items on the audio source 462 by accessing the items via pointers in the album 432.

In some cases, contents as they exist at a point in time within a playback queue may be stored as a playlist, and subsequently added to the same queue later or added to another queue. For example, contents of the playback queue 402, at a particular point in time, may be saved as a playlist, stored locally on the zone player 412 and/or on the cloud network. The saved playlist may then be added to playback queue 404 to be played by zone player 414.

V. Example Speaker Cooling Using Inaudible Audio Content

As discussed above, embodiments described herein involve speaker cooling using inaudible audio content in a playback device based on temperature of components and/or presence of audible audio content.

a. Example Component Cooling by Speaker Movement

Figure 5:
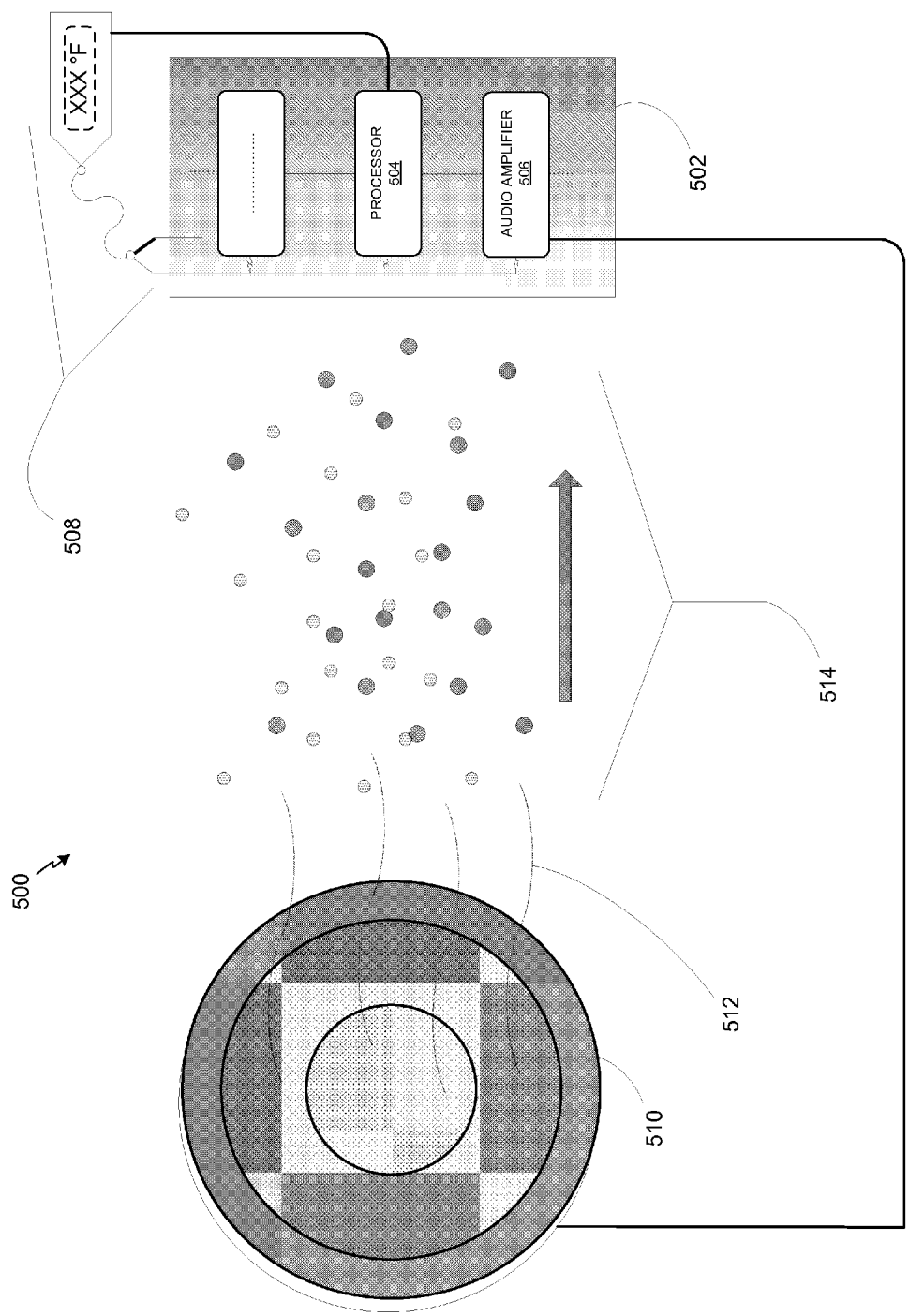
FIG. 5 shows an illustration of an example speaker cooling one or more components in an example zone player.

FIG. 5 shows an example of component cooling via speaker movement within an enclosure of a playback device 500 using airflow generated from movement of one or more speakers of the playback device. Zone player components 502 may include any or all of the components of zone player 300 as described above in association with FIG. 3. The first component shown may be processor 504, which may be the processor 308 of FIG. 3. The second component shown may be audio amplifier 506, which may be the audio amplifier 316 of FIG. 3. FIG. 5 also shows a thermal sensor 508, speaker 510, vibrations 512 and air molecules 514.

The thermal sensor 508 may be any device, such as a thermocouple, capable of detecting temperature. The thermal sensor may be configured to detect temperatures on or around one or more of the zone player components 502. The thermal sensor 508 may have one or more leads that may be positioned on or around any number of zone player components 502. Processor 504 and any of the other zone player components 502 may be connected to the thermal sensor 508 as demonstrated in FIG. 5. Further, the processor 504 may determine, based on a detection by the thermal sensor 508, that a predetermined temperature threshold is reached (such as thresholds 616 and 618 discussed below in association with FIG. 6B).

Speaker 510 may be the speaker(s) 318 of FIG. 3 as described above. While FIG. 5 shows only one speaker 510, the playback device 500 may include more than one speaker. Speaker 510 may be connected to audio amplifier 506 and any of the other zone player components 502, such as processor 504. The connection may allow one or more of the components, such as processor 504, to determine whether an audible audio content is playing.

In one example, the speaker may be configured to play inaudible audio content to assist with cooling components in the playback device when a determination has been made that an audible signal is no longer being played by the playback device and/or a determination has been made that the temperature of one or more zone player components 502, such as processor 504, is greater than a predetermined threshold. Subsequently, the speaker 510 may be configured to play inaudible audio content, which may result in vibrations 512. The vibrations 512 may cause the movement of air molecules 514 within the enclosure of playback device 500. The movement of air molecules 514 can result in the cooling of the one or more zone player components 502 exceeding the predetermined temperature threshold as demonstrated by the cooling of processor 504 in curve 614 of FIG. 6B.

Further, the processor 504 may generate less thermal energy when causing the playback device to play inaudible audio content than when the processor 504 is causing the playback device to play audible audio content. In one case, a signal file for storing the inaudible audio content to be played by the playback device may be stored locally on the playback device. As such, the playback device may not need to communicate, or stream audio content over a network when playing the inaudible content and accordingly may require less processing power (and thus less heat generation) than when streaming audio content from an external source. In another example, the signal file for storing the inaudible audio content may be simpler and easier to process than audible content, and may therefore require less processing power. In either case, playback of inaudible audio content may require less processing power from the processor 604 than playback of audible audio content, and accordingly generate less heat. As such, the overall temperature of playback device 500 and/or the temperatures of the one or more components of the playback device 500 may decrease while playing inaudible audio content because the overall heat gradient may be negative rather than constant.

In addition, speaker 510 may be configured to stop playing the inaudible audio content as soon as temperatures of the one or more zone player components 502 detected the thermal sensor 508 are below a second predetermined temperature threshold. In another example, the speaker 510 may also be configured to stop playing the inaudible audio content as soon as one or more zone player components 502, such as the processor 504, determines that audible audio content is to be played by playback device 500.

b. Example Playback Device Component Temperature Graphs

FIGS. 6A and 6B feature graphs 600 and 604, respectively, showing example temperatures over time on or around one or more components of the playback device or zone player. The temperatures may be measured using, for example, thermal sensor 508 describe above with respect to FIG. 5. The values of the example temperature and time on or around each component may differ for each zone player and for each instance that the values are recorded. It should be understood that curves 608, 610, 612 and 614 and the values represented by the curves are exemplary, and that other values and curves may be possible. Legends 602 and 606 may indicate the component represented by each curve. As suggested above, graphs 600 and 604 may show example temperatures over time on or around a processor, other components, and/or portions of the playback device. As shown, graphs 600 and 604 may provide the parameter of temperature on the vertical axis using the unit of Celsius and the parameter of time on the horizontal axis using the unit of minutes. However, each parameter may be represented on either axis while other units of temperature such as Fahrenheit and other units of time such as seconds may be used. In one example, both graphs 600 and 604 may show the temperature on or around the components as the playback device is playing audio content at a certain volume level for sixty minutes before stopping playback or reducing playback to a substantially lower volume level after sixty minutes. In other words, the playback device may be in an active state for sixty minutes before entering an inactive state, in the case playback is stopped.

Curve 608 of graph 600 and curve 612 of graph 604 may both show the example temperatures over time on or around "other components" in the playback device that do not include the processor. "Other components" may represent one or all of the components in the playback device that are not the processor. As one example, the "other components" may include the amplifier 506 in FIG. 5. Curves 608 and 612 may indicate that the temperatures on or around "other components" may increase over time as the playback device is playing audio content at a certain volume. At the sixty-minute mark, the playback device may enter the inactive state or continue playing audio content at a substantially lower volume. After the sixty-minute mark, curves 608 and 612 demonstrate that the temperature on or around "other components" may decrease.

Curve 610 of graph 600 shows the example temperatures over time on or around the playback device's processor. The processor may be the processor 504 shown in FIG. 5. As shown, the temperature on or around the processor may increase over time while the playback device may be playing audio content at a certain volume. At the sixty minute mark, the playback device may enter the inactive state or continue playing audio content at a substantially lower volume. After the sixty minute mark, curve 610 demonstrates that the temperature on or around the processor may temporarily increase before slowly decreasing.

The change in temperature over time as shown by curve 610 can be explained as follows. When the playback device is at a state of playing audio content at certain volume, a certain amount of heat or thermal energy may be present in the enclosure of the playback device. The thermal energy may be generated by one or more components. Due to the movement of the speaker while the zone player is playing audio content at maximum volume, movement of air molecules occurs and the thermal energy may be spread evenly throughout the enclosure. The air movement may stop when the playback device is no longer playing audio content because the movement of the speaker may have stopped with the stopping of audio playback. Nevertheless, the thermal energy may still be present in the enclosure. Further, at the time when audible audio content is no longer playing, some components such as a processor, may still be active and therefore may continue to generate thermal energy. Such components may create hot pockets of air that can have a temperature even higher than the temperature on or around the component at the time audio content was playing at maximum volume. These components may eventually cool down to lower temperatures but this can occur at a slow and undesirable rate.

Curve 614 of graph 604 shows the example temperatures over time on or around a processor in an example embodiment of the present application. The temperatures of curve 614 may increase in the same manner as curve 610 while the playback device is playing audio content at a certain volume. At the sixty minute mark the audio content may enter the inactive state or continue playing audio content at substantially lower volume and the temperatures on or around the processor may temporarily increase. As discussed above, a speaker of the playback device, such as speaker(s) 318 of FIG. 3 may play an inaudible audio content as soon as the first predetermined temperature threshold 616 is reached. The inaudible audio content may cause the speakers to move and generate air movement that may help cooling of the processor. As shown by curve 614, the temperature on or around the processor may cool and the playback device may stop playing the inaudible audio content when the temperature on or around the processor drops to a second predetermined temperature threshold 618. Other similar examples involving one or more other components in the playback device may also be possible.

The predetermined temperature thresholds discussed above may be established as follows. In one example, a case limit temperature of a lowest margin component may be determined to be 92° C. A temperature offset between the lowest margin component and the processor may be determined to be 8° C. The threshold may thus be determined by subtracting the temperature offset from the case limit temperature and then subtracting an additional margin (which may be 5° C.) resulting in a second predefined temperature threshold of 79° C. Other examples involving the establishment of predefined temperature thresholds may also be possible.

c. Example Method for Cooling of Playback Device Components

Figure 7:
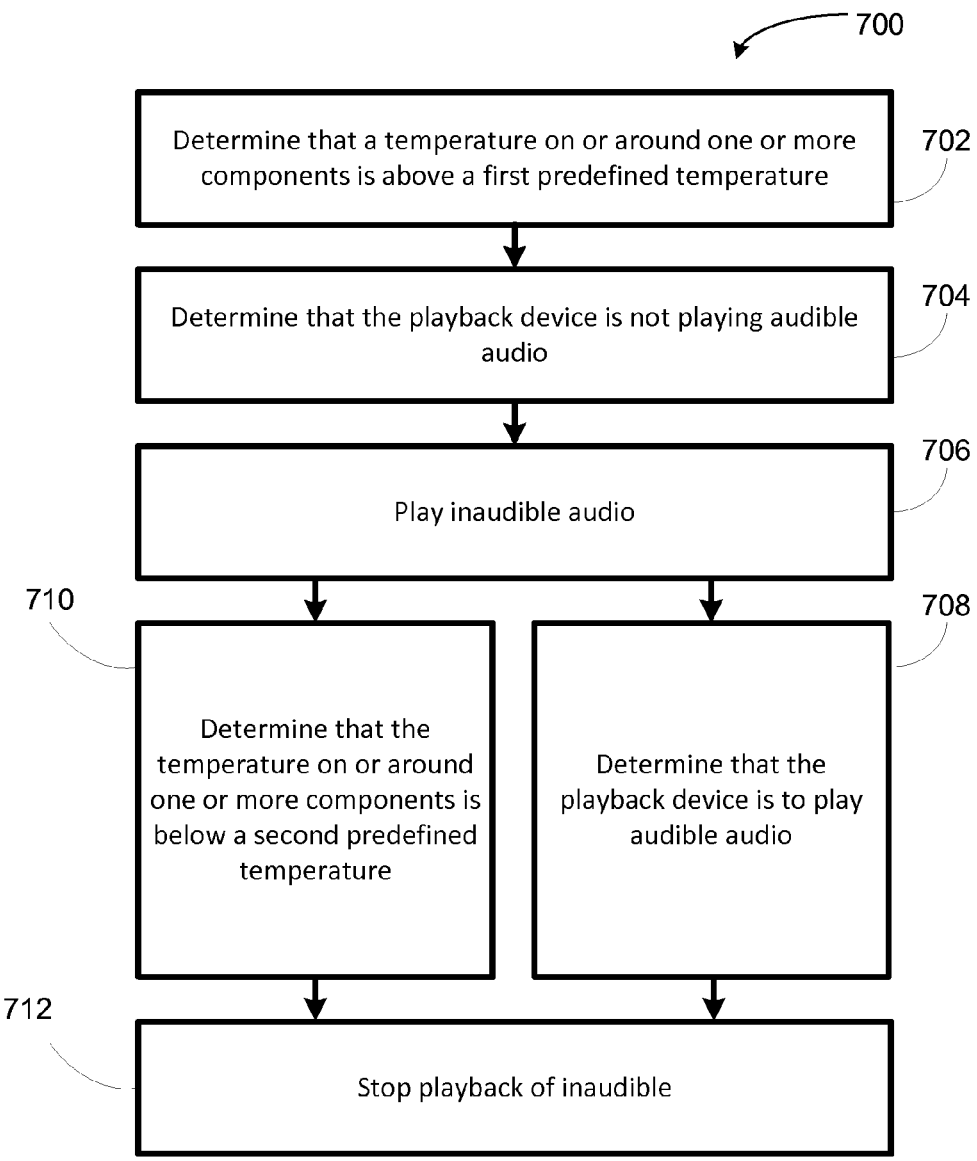
FIG. 7 shows an example flow diagram for cooling one or more components in an example zone player by playing inaudible audio content.

FIG. 7 shows an example flow diagram for speaker cooling using inaudible audio content based on temperature of components and presence of audible audio content, in accordance with at least some embodiments described herein. Method 700 shown in FIG. 7 presents an embodiment of a method that can be used in environments 100 and 400 as well as systems 200, 202, 204, and 500 for example. Method 700 may include one or more operations, functions, or actions as illustrated by one or more of blocks 702-710. Although the blocks are illustrated in sequential order, these blocks may also be performed in a different order than those described herein. Also, the various blocks may be combined into fewer blocks, divided into additional blocks, and/or removed based upon desired implementation.

In addition, for the method 700 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 700 and other processes and methods disclosed herein, each block in FIG. 7 may represent circuitry that is wired to perform the specific logical functions in the process.

At block 702, the method 700 may involve determining that a temperature on or around one or more components is above a first predetermined temperature. For illustration purposes, the components discussed hereafter may be any of the zone player components 502 described above in connection with FIG. 5. The first predetermined temperature may be a threshold temperature such as the predetermined temperature threshold 616 described above in connection with FIG. 6B. In one example, the temperature on or around a processor (such as processor 504 of FIG. 5) may be determined to be above a first predetermined temperature. In some cases, each component or portion of the playback device may have different predetermined temperature thresholds.

At block 704, the method 700 may involve determining that the playback device is not playing audible audio content. As indicated above, one or more of several indicators may be used to determine whether the playback device is playing audible audio content. A first indicator may be that the playback device is playing audio content identified in a play queue (such as playback queue 404 described above in association with FIG. 4). A second indicator may be that the playback device has received an instruction to play audio content. The playback device may receive instruction from a user via a controller, as well as other possibilities. A third indicator may be the playback of audio content, such as audio content having frequencies between 20 Hz and 20 kHz. More specifically, a processor may analyze the audio content and determine whether the audio content includes frequencies between 20 Hz and 20 kHz. A frequency range between 20 Hz and 20 kHz may be considered as the audible hearing range for a human. Audible audio content may comprise frequencies in said range but may also comprise of inaudible frequencies below 20 Hz and/or above 20 kHz. Other indicators may also be possible.

At block 706, the method 700 may involve playing inaudible audio content. One or more speakers, such as speaker(s) 318 described above in association with FIG. 3, may be configured to play the inaudible audio content. The inaudible audio content can cause the speaker to vibrate, which may result in movement of air molecules. The movement of air molecules may thus disperse the thermal energy away from the one or more components of the playback device, as described above in connection to FIG. 5.

In one example, the inaudible audio content may include one or more frequencies below 20 Hz. In another example, the inaudible audio content may include one or more frequencies above 20 kHz. The inaudible audio content in this example may include any number of frequencies below 20 Hz and/or above 20 kHz, in any possible combination. The frequencies used may be predetermined or may be randomly chosen by one or more components of the playback device. The inaudible frequencies may be chosen in association with how much air movement is required in order to disperse heat away from the one or more components at a certain rate and/or until a certain temperature is reached. All speakers may play the same set of one or more frequencies or each speaker may play a different set of one or more frequencies. Other examples are also possible.

Further, an example embodiment may include at least two speakers such that the inaudible audio content played by one speaker is out of phase with the inaudible audio content played by the other speaker. In this embodiment, playback of out of phase audio signals may (1) minimize audibility of the audio content being played, (2) result in increased internal air movement in the enclosure of the playback device such that the heat may disperse more rapidly, and (3) help maintain the pressure inside the enclosure of the playback device. In some cases, maintaining the pressure inside the enclosure may reduce the power required for generating air movement.

At block 708, the method 700 may involve determining that the playback device is to play audible audio content. One or more components of the playback device may be configured to determine that audible audio content is to be played by the playback device using one or more of the indicators discussed above. At block 710, the method 700 may involve determining that the temperature on or around one or more components is below a second predetermined temperature. To illustrate, a second predetermined temperature may be a threshold such as the predetermined temperature threshold 618 described above in association with FIG. 6B. In one example, the temperature on or around a processor (such as the processor in association with curve 614 of FIG. 6B) may decrease to a temperature below a second predetermined temperature partially as a result of the cooling effect generated from movements of the speakers playing inaudible audio content.

At block 712, the method 700 may involve stopping playback of inaudible audio content. As indicated above, stopping playback of inaudible audio content may be in response to determining that the playback device is to play audible audio content as discussed in connection to block 708 and/or determining that the temperature on or around one or more components is below a second predetermined temperature as discussed in connection to block 710. Stopping playback of inaudible audio content may be done by one or more components, such as a processor or an audio processing component (such as processor 308 and audio processing component 312 as described above in association with FIG. 3). In some cases, the temperature on or around the one or more components may continue to decline naturally after playback of inaudible audio content has stopped.

VI. Conclusion

As indicated above, the present application involves speaker cooling using inaudible audio content in a playback device based on temperature of components and/or presence of audible audio content. In one aspect, a method is provided. The method involves determining, based on a detection by a thermal sensor, a temperature on or around one or more components that are located within a sealed enclosure of a playback device. The playback device comprises at least one speaker configured to play audio content. The method also involves determining that the temperature is greater than a predetermined value and responsively causing the at least one speaker to play inaudible audio content. The playback of inaudible audio content causes the at least one speaker to vibrate and disperse heat away from the one or more components.

In another aspect, a second method is provided. The method involves determining, based on detection by a thermal sensor, whether a temperature of at least a portion of the playback device is above a first predetermined temperature. The method further involves determining, based on detection by a thermal sensor, whether a temperature of at least a portion of the playback device is above a first predetermined temperature. The method also involves determining by the playback device whether the playback device is playing audible audio content through the speaker and playing inaudible audio content by the playback device when: (i) the temperature of the at least a portion of the playback device is determined to be above the first predetermined temperature, and (ii) the playback device is determined to not be playing audible audio content.

In yet another aspect, a non-transitory computer readable storage medium is provided. The non-transitory computer readable storage medium includes a set of instructions for execution by a processor. The set of instructions, when executed, cause a playback device to determine whether a temperature of at least a portion of the playback device is above a first predetermined temperature. The set of instructions, when executed, also cause a playback device to determine whether the playback device is playing audible audio content and play inaudible audio content when: (i) the temperature of the at least a portion of the playback device is determined to be above the first predetermined temperature, and (ii) the playback device is determined not to be playing audible audio content.

Additionally, references herein to "embodiment" means that a particular feature, structure, or characteristic described in connection with the embodiment can be included in at least one example embodiment of the invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

We claim:

1. A playback device, comprising:
   at least one processor;
   at least one speaker; and
   memory having stored thereon instructions executable by the at least one processor to cause the playback device to perform functions comprising:
      while playing audible audio content via the at least one speaker, receiving input data indicating an instruction to stop playback of the audible audio content;
      determining that playback of the audible audio content has stopped; and
      based on the determination that playback of the audible audio content has stopped, playing inaudible audio content to cause the at least one speaker to vibrate thereby inducing air movement within the playback device.

2. The playback device of claim 1, wherein the audible audio content is a first audible audio content, and wherein the functions further comprise:
   while playing the inaudible audio content, receiving input data indicating an instruction to begin playing a second audible audio content; and
   based on the input data indicating the instruction to begin playing the second audible audio content, (i) stopping playback of the inaudible audio content and (ii) beginning playback of the second audible audio content.

3. The playback device or claim 1, wherein the functions further comprise:
   while playing the inaudible audio content, detecting, via a thermal sensor of the playback device, a temperature of the playback device;
   determining that the temperature is less than a threshold temperature; and
   stopping playback of the inaudible audio content after determining that the temperature is less than the threshold temperature.

4. The playback device of claim 1, wherein playing the inaudible audio content comprises:
   playing the inaudible audio content for a pre-determined duration of time.

5. The playback device of claim 1, wherein the functions further comprise:
   detecting, via a thermal sensor of the playback device, a temperature of the playback device; and
   wherein playing the inaudible audio content comprises playing the inaudible audio content while the detected temperature is greater than a threshold temperature.

6. The playback device of claim 1, wherein the at least one speaker comprises one or more first speakers and one or more second speakers, and wherein playing the inaudible audio content comprises:
   causing the one or more first speakers to vibrate; and
   causing the one or more second speakers to vibrate out of phase with the one or more first speakers.

7. The playback device of claim 1, wherein the inaudible audio content comprises audio content at frequencies above 20 KHz.

8. The playback device of claim 1, wherein the inaudible audio content comprises audio content at frequencies below 20 Hz.

9. A non-transitory computer-readable medium having stored thereon instructions executable by a playback device to perform functions comprising:
   while playing audible audio content via at least one speaker, receiving input data indicating an instruction to stop playback of the audible audio content by the playback device;
   determining that playback of the audible audio content has stopped; and
   based on the determination that playback of the audible audio content has stopped, playing inaudible audio content to cause the at least one speaker to vibrate thereby inducing air movement within the playback device.

10. The non-transitory computer-readable medium of claim 9, wherein the audible audio content is a first audible audio content, and wherein the functions further comprise:
    while playing the inaudible audio content, receiving input data indicating an instruction to begin playing a second audible audio content; and
    based on the input data indicating the instruction to begin playing the second audible audio content, (i) stopping playback of the inaudible audio content and (ii) beginning playback of the second audible audio content.

11. The non-transitory computer-readable medium of claim 9, wherein the functions further comprise:
    while playing the inaudible audio content, detecting, via a thermal sensor of the playback device, a temperature of the playback device;
    determining that the temperature is less than a threshold temperature; and
    stopping playback of the inaudible audio content after determining that the temperature is less than the threshold temperature.

12. The non-transitory computer-readable medium of claim 9, wherein playing the inaudible audio content comprises:
    playing the inaudible audio content for a pre-determined duration of time.

13. The non-transitory computer-readable medium of claim 9, wherein the functions further comprise:
    detecting, via a thermal sensor of the playback device, a temperature of the playback device; and
    wherein playing the inaudible audio content comprises playing the inaudible audio content while the detected temperature is greater than a threshold temperature.

14. The non-transitory computer-readable medium of claim 9, wherein the at least one speaker of the playback device comprises one or more first speakers and one or more second speakers, and wherein playing the inaudible audio content comprises:
    causing the one or more first speakers to vibrate; and
    causing the one or more second speakers to vibrate out of phase with the one or more first speakers.

15. A method comprising:

while a playback device is playing audible audio content via at least one speaker, receiving, via the playback device, input data indicating an instruction to stop playback of the audible audio content by the playback device;

determining, via the playback device, that playback of the audible audio content has stopped; and based on the determination that playback of the audible audio content has stopped, playing, via the at least one speaker of the playback device, inaudible audio content to cause the at least one speaker to vibrate thereby inducing air movement within the playback device.

16. The method of claim 15, wherein the audible audio content is a first audible audio content, and wherein the method further comprises:

while the playback device is playing the inaudible audio content, receiving, via the playback device, input data indicating an instruction to begin playing a second audible audio content; and based on the input data indicating an instruction to begin playing the second audible audio content, (i) stopping playback of the inaudible audio content and (ii) beginning, via the playback device, playback of the second audible audio content.

17. The method of claim 15, further comprising:

while the playback device is playing the inaudible audio content, detecting, via a thermal sensor of the playback device, a temperature of the playback device;

determining, via the playback device, that the temperature is less than a threshold temperature; and stopping playback of the inaudible audio content after determining that the temperature is less than the threshold temperature.

18. The method of claim 15, wherein playing the inaudible audio content comprises:

playing, via the playback device, the inaudible audio content for a pre-determined duration of time.

19. The method of claim 15, further comprising:

detecting, via a thermal sensor of the playback device, a temperature of the playback device; and wherein playing the inaudible audio content comprises playing the inaudible audio content while the detected temperature is greater than a threshold temperature.

20. The method of claim 15, wherein the at least one speaker of the playback device comprises one or more first speakers and one or more second speakers, and wherein playing the inaudible audio content comprises:

causing, via the playback device, the one or more first speakers to vibrate; and causing, via the playback device, the one or more second speakers to vibrate out of phase with the one or more first speakers.

* * * * *